United States Patent
Tronche et al.

[11] Patent Number: 5,917,388
[45] Date of Patent: Jun. 29, 1999

[54] COMPACT MICROWAVE MODULE

[75] Inventors: Christian Tronche; Philippe Monfraix, both of Toulouse; Augustin Coello Vera, Pibrac, all of France

[73] Assignee: Alcatel Espace, Nanterre Cedex, France

[21] Appl. No.: 08/825,956

[22] Filed: Apr. 3, 1997

[30] Foreign Application Priority Data

Apr. 4, 1996 [FR] France .................................. 96 04249

[51] Int. Cl.⁶ ...................................................... H01P 5/00
[52] U.S. Cl. ........................... 333/246; 29/600; 333/247; 361/792
[58] Field of Search ............................ 333/33, 238, 246, 333/247, 260; 257/664, 728; 29/600; 361/792, 794, 795

[56] References Cited

U.S. PATENT DOCUMENTS

| | | | |
|---|---|---|---|
| 3,303,439 | 2/1967 | Fulp | 333/246 |
| 4,899,118 | 2/1990 | Polinski, Sr. | 333/246 |
| 5,057,798 | 10/1991 | Moye et al. | 333/33 |
| 5,294,897 | 3/1994 | Notani et al. | 333/33 |
| 5,406,125 | 4/1995 | Johnson et al. | 257/774 |
| 5,644,277 | 7/1997 | Gulick et al. | 333/246 |
| 5,689,216 | 11/1997 | Sturdivant | 333/33 |
| 5,768,109 | 6/1998 | Gulick et al. | 257/728 X |

FOREIGN PATENT DOCUMENTS 2697374  4/1994  France .

Primary Examiner—Paul Gensler
Attorney, Agent, or Firm—Sughrue, Mion, Zinn, Macpeak & Seas, PLLC

[57] ABSTRACT

The invention provides a microwave module including a plurality of stacked elementary structures forming a unit, each elementary structure comprising a bottom dielectric layer on a top surface of which an integrated circuit (20, 21) is disposed, and a top dielectric layer covering the circuit (20, 21). The module is characterized by a connection line (20a, 30, 21a) between two respective circuits belonging to first and second elementary structures, the connection line being constituted by an input coplanar line (21a) disposed on the top surface of the bottom dielectric layer of the first structure, by an output coplanar line (20a) disposed on the top surface of the bottom dielectric layer of the second structure, and a by link coplanar line (30) connecting one end of the input coplanar line to one end of the output coplanar line.

14 Claims, 4 Drawing Sheets

COMPACT MICROWAVE MODULE

The present invention generally relates to a microwave module and to a method of manufacturing such a module. By way of non-limiting example, such a module may be used to form one or a plurality of active modules having radiating elements in an active antenna, such modules being disposed in the form of a matrix. The term "microwave" is used in the remainder of the description both for the centimeter wavelength range and for the millimeter wavelength range.

Document U.S. Pat. No. 5,294,897 discloses a single-component structure having a coplanar line. The structure presented comprises a dielectric substrate on which an input coplanar line portion and an output coplanar line portion are mounted, which portions are applied respectively to the input and to the output of an integrated circuit. Each coplanar line portion (both the input portion and the output portion) comprises a top portion carried by a top face of the substrate, an intermediate portion passing through the substrate, and a bottom portion carried by the plane of the bottom face of the substrate. The top, intermediate, and bottom portions are generally stair-shaped, the two outer grounding conductors, and the central grounding conductor of the bottom portion of the coplanar line being designed to be put in contact with the corresponding terminals of a printed circuit. That structure suffers from the main drawback that associating a plurality of components, each of which performs a given function, such as amplification, phase-shifting, etc., requires a large support area. Furthermore, in that structure, a wave propagates along the coplanar line from component to component by passing through a non-uniform medium that is sometimes formed by a layer of substrate, sometimes formed by air.

To remedy the drawback of the large support area required by that first structure, it is known in the prior art, e.g. as recalled in Document FR-A-2 697 374, that it is possible to use a compact microwave module comprising a plurality of stacked elementary structures, each structure being constituted by one or more integrated circuits, or chips, coated with a dielectric. In that document, a link between two integrated circuits belonging respectively to two distinct structures is set up by a wire that passes through the dielectric zone separating the two circuits via a hole formed in said zone. That structure suffers from the main drawback that a high-frequency wave propagates poorly along such a wire link.

An object of the invention is to remedy the abovementioned drawbacks by providing a microwave module that is particularly compact and that substantially prevents any disturbance in the radio signals conveyed between circuits.

To this end, in a first embodiment of the invention, a microwave module comprising:

a plurality of stacked elementary structures forming a unit, each elementary structure comprising a bottom dielectric layer on a top surface of which an integrated circuit is disposed, and a top dielectric layer covering the circuit; and a connection line for connecting a first integrated circuit mounted on a dielectric layer of a first structure of said plurality of structures to a second integrated circuit mounted on a dielectric layer of a second structure of said plurality of structures;

is characterized in that the connection line comprises an input coplanar line disposed on the top surface of the bottom dielectric layer of the first structure, an output coplanar line disposed on the top surface of the bottom dielectric layer of the second structure, and a link coplanar line connecting one end of the input coplanar line to one end of the output coplanar line.

Typically, to provide shielding and a good heatsink, a given elementary structure is separated from an immediately adjacent elementary structure by a ground element.

In which case, both said input coplanar line and said output coplanar line extend beyond planes including the respective edges of the ground element(s) separating said first elementary structure and said second elementary structure, so that said link coplanar line is offset outwardly relative to the ground element(s).

A method of manufacturing a module includes the following steps:

molding a rectangular unit comprising a plurality of stacked elementary structures, each elementary structure comprising a bottom dielectric layer on a top surface of which an integrated circuit is disposed, and a top dielectric layer covering the circuit;

cutting said unit along parallel cutting planes that are disposed inside respective facing faces of said unit so as to cause two new faces to appear, respective sets of ends of grounding conductors and of a signal conductor then appear thereon, each set being associated with a respective coplanar line;

metal plating said two new faces; and etching the metal-plated new faces so as to form a link coplanar line connecting the ends of grounding conductors and of a signal conductor of an input coplanar line of a first elementary structure to respective ends of grounding conductors and of a signal conductor of an output coplanar line of a second elementary structure.

When ground elements, or planes, are provided to separate two elementary structures, the method further includes the following steps:

re-molding the etched unit so as to cover the link coplanar line with a dielectric casing;

machining the re-molded etched unit through at least one of its faces at points facing the edges of a ground element so as to form access perforations between each ground element and the outside; and shielding the unit by metal plating the entire unit, said shielding being in electrical connection with the ground elements via said metal-plated access perforations.

In a second variant of the invention, a compact microwave module comprising:

a plurality of stacked elementary structures forming a unit, each elementary structure comprising a bottom dielectric layer on a top surface of which an integrated circuit is disposed, and a top dielectric layer covering the circuit; and a connection line for connecting a first integrated circuit mounted on a bottom dielectric layer of a first structure of said plurality of structures to a second integrated circuit mounted on a bottom dielectric layer of a second structure of said plurality of structures;

is characterized according to the invention in that it further comprises:

a ground element for separating each given elementary structure from an immediately adjacent elementary structure;

and in that said connection line comprises an input coplanar line which is disposed on the top surface of the bottom dielectric layer of the first structure, an output coplanar line which is disposed on the top surface of the bottom dielectric layer of the second structure, and a link line comprising firstly a signal first conductor strand connecting a signal conductor of the input coplanar line to a signal conductor of the output coplanar line via a first hole through each bottom and top dielectric layer and through each ground element separating said two circuits, and secondly at least one grounding second conductor strand connecting at least one of the grounding conductors of the input coplanar line to at least one of the grounding conductors of the output coplanar line via a respective second hole passing through each bottom and top dielectric layer and through each ground element separating said two circuits.

Advantageously, said at least one grounding second conductor strand is in contact with each ground element separating said two circuits.

For example, said at least one grounding second conductor strand may be formed by metal plating said second hole.

Furthermore, the two grounding conductors of each of said input and output coplanar lines may be connected together at their respective ends via an additional grounding conductor.

It is possible to provide a plurality of second strands connecting together said grounding conductors and said additional grounding conductor of the input coplanar line and said grounding conductors and said additional conductor of the output coplanar line, said plurality of second strands being disposed in a circular arc.

Other characteristics and advantages of the present invention appear more clearly on reading the following description given with reference to the corresponding accompanying drawings, in which.

Figure 1:
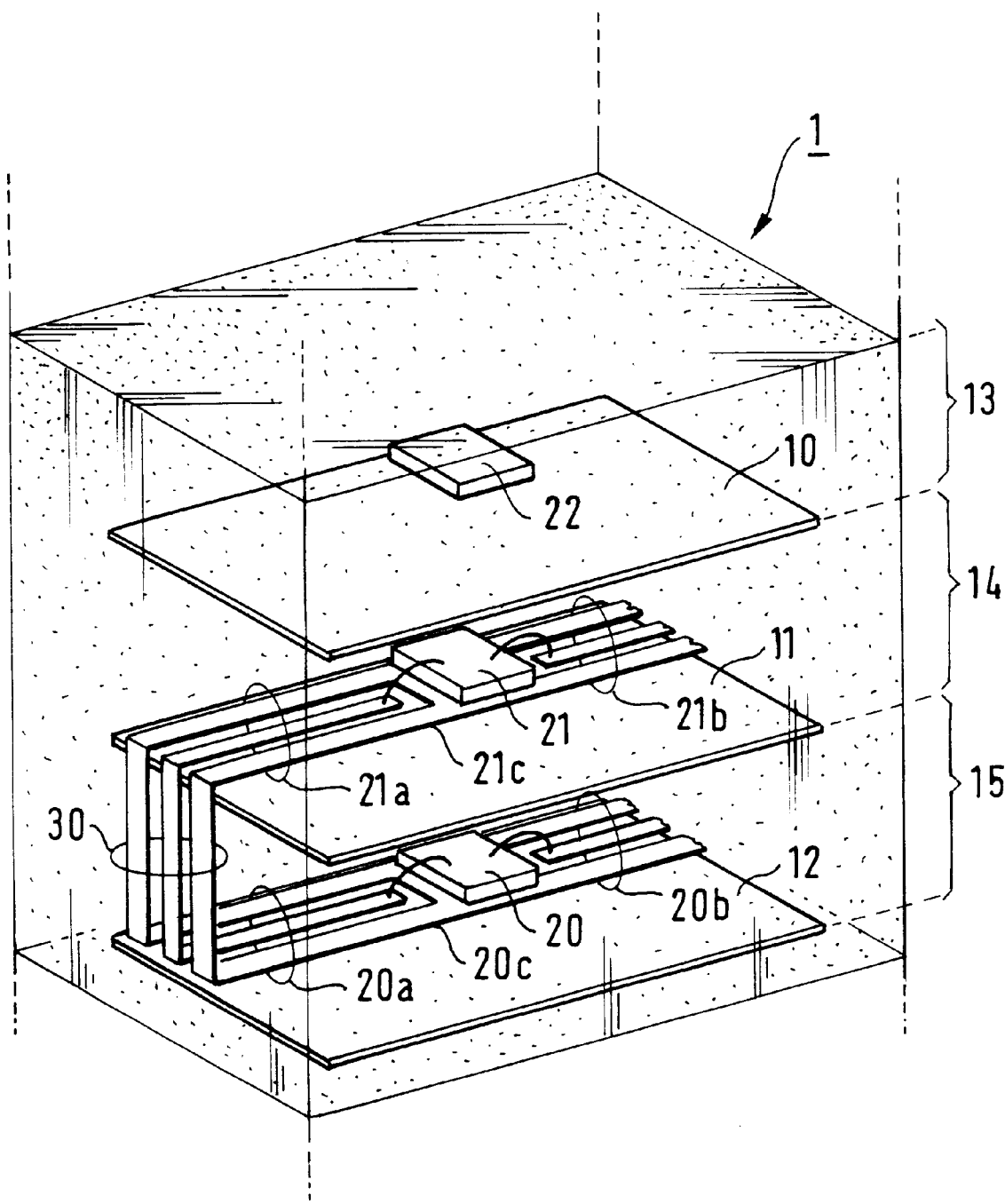
FIG. 1 is a perspective view of a microwave module of the invention, showing a coplanar line link between two integrated circuits.
Figure 2:
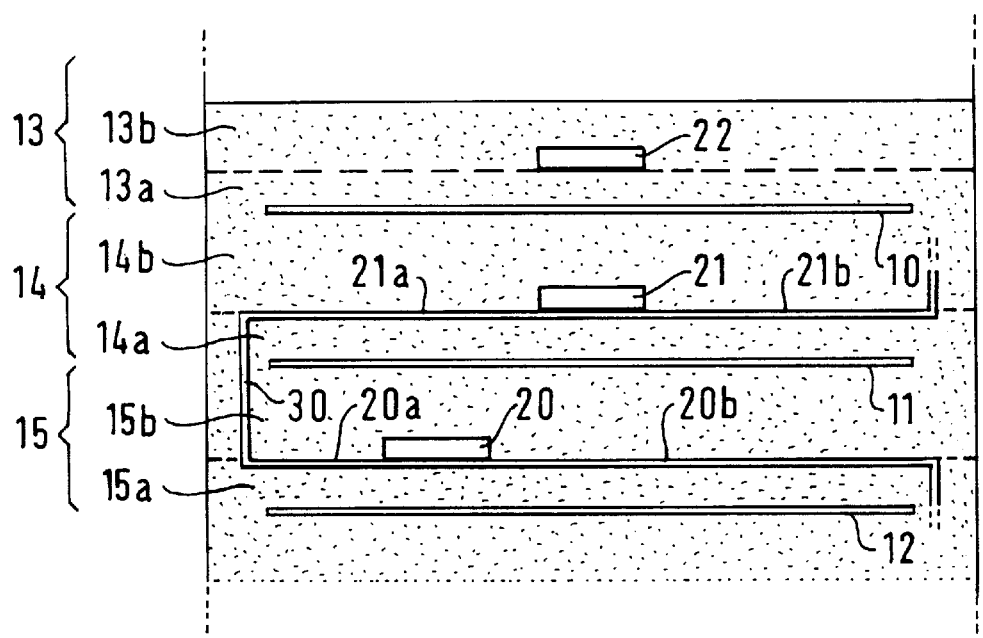
FIG. 2 is a cross-section view of the module shown in FIG. 1.

As shown in FIGS. 1 and 2, a microwave module of the invention comprises at least two stacked elementary structures that together form a unit. Each elementary structure comprises one or more integrated circuits, or chips, 20, 21, 22 which are disposed between two layers of dielectric substrate which together form a dielectric casing 15, 14, 13 for the integrated circuit(s) of the elementary structure in question. Thus, by way of example, for the elementary structure containing the circuit 20, said circuit 20 is housed in a dielectric casing 15 made up of a bottom dielectric layer 15a on a top surface of which the integrated circuit 20 is disposed, and of a top dielectric layer 15b covering said circuit. In practice, it is possible to distinguish between the bottom dielectric layer—15a, 14a, 13a—and the top dielectric layer 15b, 14b, 13b—of each elementary structure because they are built up successively during manufacture of the module, as appears more clearly below. Each elementary structure may be separated from an immediately adjacent elementary structure by a ground plane 10, 11, 12. Between two immediately adjacent bottom and top elementary structures, the ground plane 11 is typically disposed between the bottom dielectric layer 14a of the top elementary structure and the top dielectric layer 15b of the bottom elementary structure. In FIGS. 1 and 2, the ground plane 11 separates the elementary structure containing the component 20 from the elementary structure containing the component 21.

A more detailed description follows of a coplanar line link, in a first embodiment of the invention, between two integrated circuits 20 and 21 belonging to respective ones of two elementary structures. In this coplanar line link, it is assumed that circuit 20 outputs a signal to be applied to the input of circuit 21. In the accompanying figures, the two integrated circuits 20 and 21 belong to respective ones of two elementary structures that are immediately adjacent. However, a person skilled in the art will understand that the circuits 20 and 21 may be separated by one or more other elementary structures.

Figure 3:
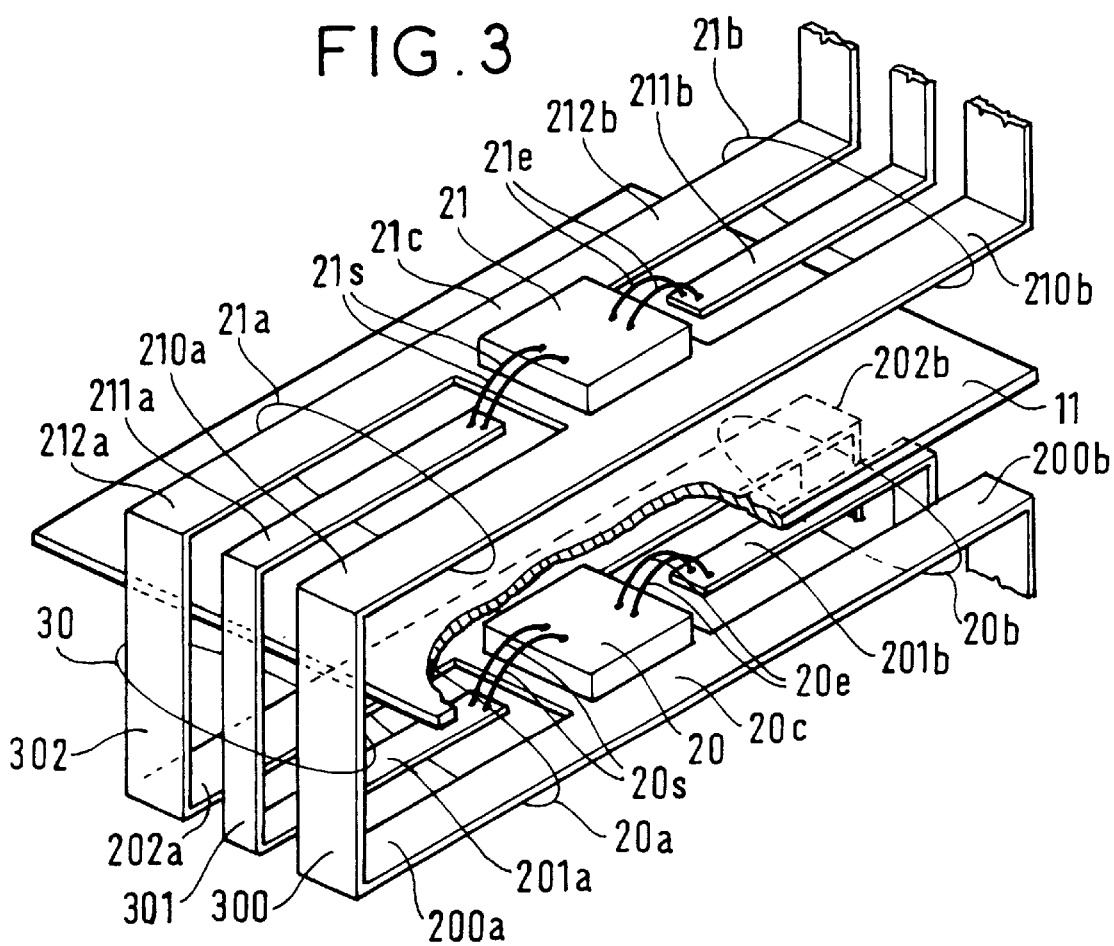
FIG. 3 is a detailed perspective view of a coplanar line link between two integrated circuits belonging to respective ones of two distinct stages of the module, in a first variant of the invention.

With reference, in particular, to FIG. 3, the circuit 21 is mounted on and grounded by a support grounding conductor 21c, and it is connected to an input coplanar line 21a and to an output coplanar line 21b. The support grounding conductor 21c, the input coplanar line 21a, and the output coplanar line 21b are carried by the bottom dielectric layer 14a of the elementary structure containing the circuit 21. The input coplanar line 21a comprises two grounding conductor elements 210a and 212a flanking and coplanar with a signal conductor element 211a, and the output coplanar line 21b comprises two grounding conductor elements 210b and 212b flanking and coplanar with a signal conductor element 211b. The two grounding conductor elements 210a and 212a of the input coplanar line 21a and the two grounding conductor elements 210b and 212b of the output coplanar line 21b are connected to the support grounding conductor 21c to take the form of a generally H-shaped plane structure. The signal conductor element 211a is disposed in coplanar manner between the two branches 210a and 212a of the H-shaped plane structure, and the signal conductor element 211b is disposed in coplanar manner between the two branches 210b and 212b of the H-shaped plane structure. Respective ends of the signal conductor elements 211a and 211b, facing the support grounding conductor 21c, are connected to the electrode supports of the circuit 21 via respective curved wires 21e and 21s. Similarly, the circuit 20 is mounted on and grounded by a support grounding conductor 20c, and it is connected to an input coplanar line 20b and to an output coplanar line 20a. The support grounding conductor 20c, the input coplanar line conductor 20b and the output coplanar line conductor 20a are carried by the bottom dielectric layer 15a of the elementary structure containing the circuit 20. The input coplanar line 20b comprises two grounding conductor elements 200b and 202b flanking and coplanar with a grounding conductor element 201b, and the output coplanar line 20a comprises two grounding conductor elements 200a and 202a flanking and coplanar with a grounding conductor element 201a. The two grounding conductor elements 200b and 202b of the input coplanar line 20b and the two grounding conductor elements 200a and 202a of the output coplanar line 20a are connected to the support grounding conductor 20c to take the form of a generally H-shaped plane structure. The signal conductor element 201b is disposed in coplanar manner between the two branches 200b and 202b of the H-shaped plane structure, and the signal conductor element 201a is disposed in coplanar manner between the two branches 200a and 202a of the H-shaped plane structure. Respective ends of the signal conductor elements 201b and 201a, facing the support grounding conductor 20c, are connected to the electrode supports of the circuit 20 via respective curved wires 20e and 20s.

A link intermediate coplanar line 30, comprising two grounding conductors 300 and 302 flanking and coplanar with a signal conductor element 301 set up a connection between the output coplanar line 20a and the input coplanar line 21a. The grounding conductor 300 connects one end of grounding conductor 210a of the input coplanar line 21a to one end of the grounding conductor 200a of the output coplanar line 20a, and the grounding conductor 302 connects one end of the grounding conductor 212a of the input coplanar line 21a to one end of the grounding conductor 202a of the output coplanar line 20a. The signal conductor 301 connects one end of the signal conductor 211a of the input coplanar line to one end of the signal conductor 201a of the output coplanar line 20a.

Such a multi-level "all coplanar line" link between two circuits belonging to respective ones of two stacked elementary structures makes the resulting module very compact while guaranteeing good propagation of the signal between the two circuits 20 and 21. This good propagation of the signal between the circuits 20 and 21 is provided in spite of the link intermediate coplanar line 30 being disposed perpendicular to the input coplanar line 21a and to the output coplanar line 20a. This results from the shape of the field lines that propagate in the coplanar lines, these field lines being substantially transverse to the coplanar lines. Typically, for a coplanar line, the field lines between one of the two grounding conductors and the signal conductor, and the field lines between the other of the two grounding conductors and the signal conductor are in opposite directions.

In practice, propagation in a coplanar line cannot take place in this almost-TEM ideal coplanar fundamental mode in which the electric fields are applied between each grounding conductor and the signal conductor. Other parasitic modes are then added and they must be attenuated, or even prevented, in particular by choosing a suitable geometric shape for the coplanar lines and defining a suitable substrate thickness.

Such parasitic modes include in particular the "microstrip" mode, and the "parallel-plane" volume mode. The microstrip mode is characterized by an electric field between the signal conductor, e.g. 211a, and the ground plane 11 immediately below, the parallel-plane volume mode defining an electric field between the signal conductor and firstly the grounding conductors, and secondly the ground plane immediately below. The microstrip mode can be attenuated by choosing the signal conductor 211a to have a width considerably smaller than the thickness of the substrate or bottom layer 14a. It is also possible to choose a slot width between a ground conductor and a signal conductor that is small compared with the thickness of the coplanar line. It is also possible to use a substrate of relatively large thickness, typically about 400 $\mu$m, without this thickness being too large because otherwise it gives rise to a rectangular-type mode of the TE-type.

As shown in FIG. 3, when a ground plane 11 is provided between each elementary structure, both the input coplanar line 21a and the output coplanar line 20a extend beyond planes including the respective edges of the ground element (s) separating the elementary structures to which the circuits 20 and 21 respectively belong, so that so that the link coplanar line is offset outwardly relative to the ground element(s) separating the two structures in question.

Advantageously, in all cases, the link coplanar line 30 is preferably integrated in the module by being covered with a dielectric layer, so as to avoid any electrical mismatching resulting from the signal propagating through media, namely the substrate and air, having different respective permittivities.

Figure 4:
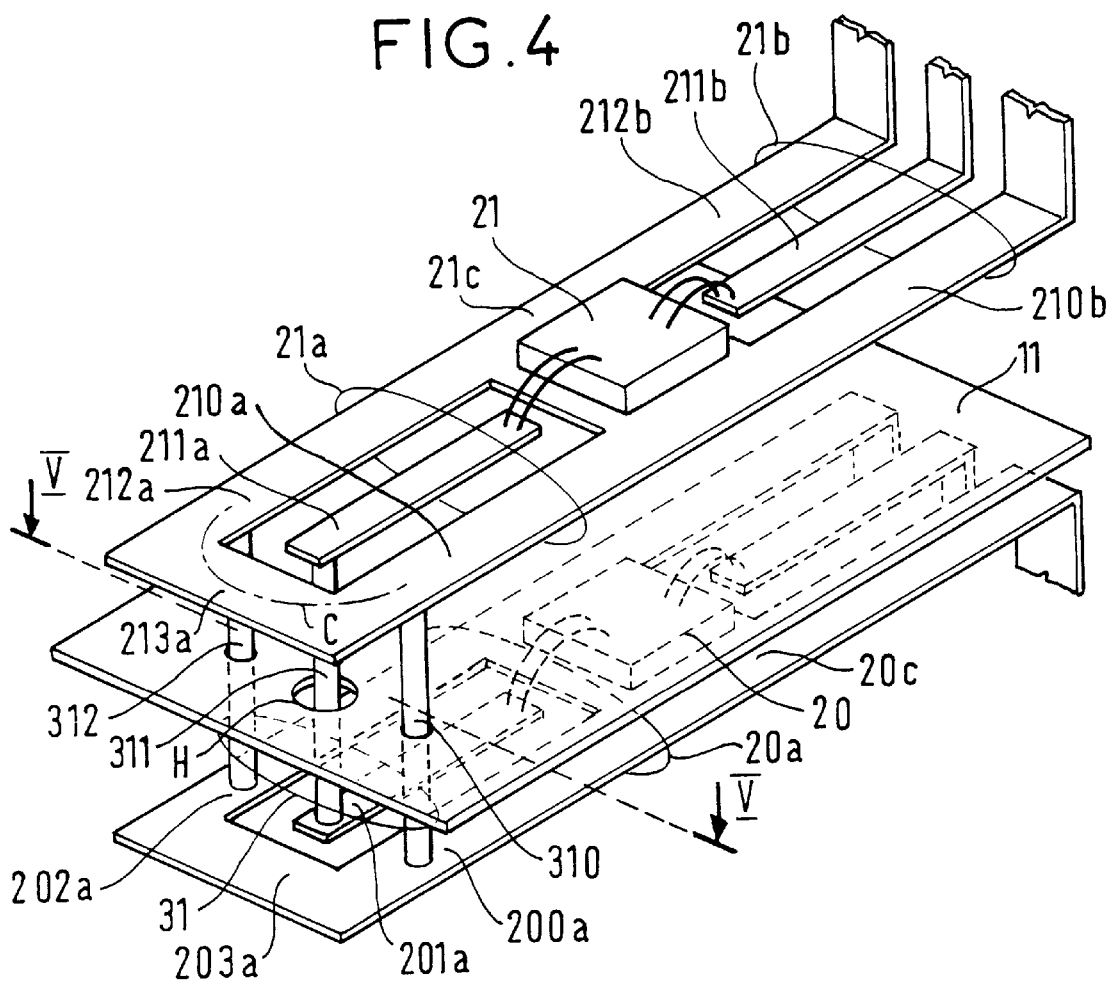
FIG. 4 is a detailed perspective view of a metal-plated hole link between two integrated circuits belonging to respective ones of two distinct stages of the module, in a second variant of the invention.
Figure 5:
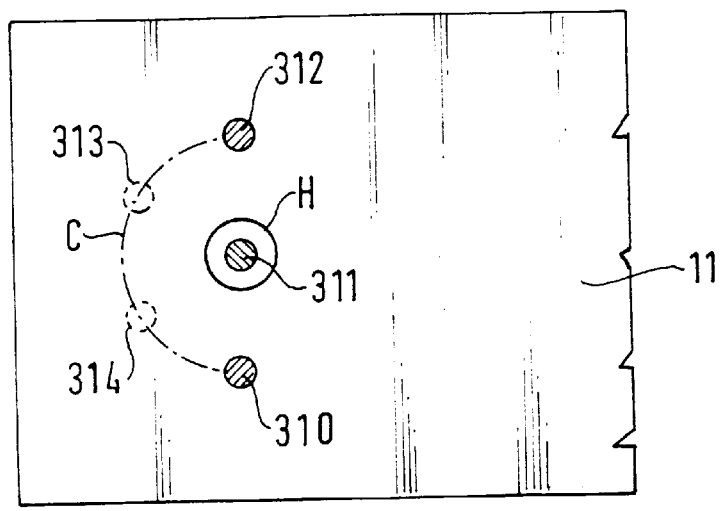
FIG. 5 is a section view of the embodiment shown in FIG. 4.

With reference to FIGS. 4 and 5, a second embodiment of the invention is described below. In the same way as the above variant, the circuit 21 is mounted on and grounded by a support grounding conductor 21c, and it is connected to an input coplanar line 21a and to an output coplanar line 21b. The support grounding conductor 21c, the input coplanar line 21a, and the output coplanar line 21b are carried by the bottom dielectric layer 14a of the elementary structure containing the circuit 21. The input coplanar line portion 21a comprises two grounding conductor elements 210a and 212a flanking and coplanar with a signal conductor element 211a, and the output coplanar line 21b comprises two grounding conductor elements 210b and 212b flanking and coplanar with a signal conductor element 211b. The two grounding conductor elements 210a and 212a of the input coplanar line 21a and the two grounding conductor elements 210b and 212b of the output coplanar line 21b are connected to the support grounding conductor 21c to take the form of a generally H-shaped plane structure. The signal conductor element 211a is disposed in coplanar manner between the two branches 210a and 212a of the H-shaped plane structure, and the signal conductor element 211b is disposed in coplanar manner between the two branches 210b and 212b of the H-shaped plane structure. Respective ends of the signal conductor elements 211a and 211b, facing the support grounding conductor 21c, are connected to the electrode supports of the circuit 21 via respective curved wires 21e and 21s. Furthermore, the circuit 20 is mounted on and grounded by a support grounding conductor 20c, and it is connected to an input coplanar line 20b and to an output coplanar line 20a. The support grounding conductor 20c, the input coplanar line conductor 20b and the output coplanar line conductor 20a are carried by the bottom dielectric layer 15a of the elementary structure containing the circuit 20. The input coplanar line 20b comprises two grounding conductor elements 200b and 202b flanking and coplanar with a grounding conductor element 201b, and the output coplanar line 20a comprises two grounding conductor elements 200a and 202a flanking and coplanar with a grounding conductor element 201a. The two grounding conductor elements 200b and 202b of the input coplanar line 20b and the two grounding conductor elements 200a and 202a of the output coplanar line 20a are connected to the support grounding conductor 20c to take the form of a generally H-shaped plane structure. The signal conductor element 201b is disposed in coplanar manner between the two branches 200b and 202b of the H-shaped plane structure, and the signal conductor element 201a is disposed in coplanar manner between the two branches 200a and 202a of the H-shaped plane structure. Respective ends of the signal conductor elements 201b and 201a, facing the support grounding conductor 20c, are connected to the electrode supports of the circuit 20 via respective curved wires 20e and 20s. In this second variant, each given elementary structure is separated by an immediately adjacent elementary structure by a ground plane 11. Advantageously, both of the grounding conductors 210a and 212a of the input coplanar line 21a are connected together at their respective ends via an additional grounding conductor 213a disposed perpendicular to the grounding conductors, and both of the grounding conductors 200 and 202a of the output coplanar line 20a are connected together at their respective ends via an additional grounding conductor 203a.

In the second variant, the link between the output coplanar line 20a and the input coplanar line 21a is provided by firstly a signal first conductor strand 311 connecting the signal conductor 211a of the input coplanar line 21a to the signal conductor 201a of the output coplanar line 20a via a hole H passing through each bottom dielectric layer, each top dielectric layer, and each ground plane 11 separating the two circuits 20 and 21, and secondly at least one grounding second conductor strand 310, 312 connecting at least one of the grounding conductors 210a, 212a of the input coplanar line 21a to at least one of the grounding conductors 200A, 202a of the output coplanar line 21a via a hole passing through each bottom dielectric layer, each top dielectric layer, and each ground element separating the two circuits 20 and 21.

Typically, each of the grounding second conductor strands 310, 312 is formed by through hole metal-plating. Thus, the metal-plating strand takes up the entire hole through which it passes. Furthermore, in order to make the ground potentials as uniform as possible, each of the grounding second conductor strands 310, 312 is in contact with each ground plane that separates the two circuits 20 and 21. In a variant, a grounding second strand is made up of a plurality of strand portions. If N designates the number of ground planes separating the two circuits 20 and 21, (N+1) grounding strand portions are provided. Relative to a given ground plane, the ends of two of the (N+1) grounding strand portions are fixed facing each other on either side of the ground plane.

In FIG. 4, only two grounding conductor strands 310 and 312 are shown. However, as shown in FIG. 5, advantageously, a plurality of second strands 310, 312, 313, and 314 may be used to connect together the grounding conductors 200a, 202a and the additional grounding conductor 203a of the output coplanar line 20a and said grounding conductors 210a, 212a and the additional grounding conductor 213a of the input coplanar line 21a. In a coplanar line, such as 21a, respective ends of the second strands come into contact with the bottom surfaces of the grounding conductors 210a, 212a and of the additional grounding conductor 213a of the input coplanar line 21a, these contact points defining, for example, a circular arc. In practice, any other layout may be used, by providing a plurality of second strands surrounding at least in part the signal conductor strand 311. This alternative offers coaxial line type propagation of the signal between the output coplanar line 20a and the input coplanar line 21a because the grounding second conductor strands 310, 312, 313, and 314 are disposed "peripherally" around the signal conductor strand 311.

Figure 6:
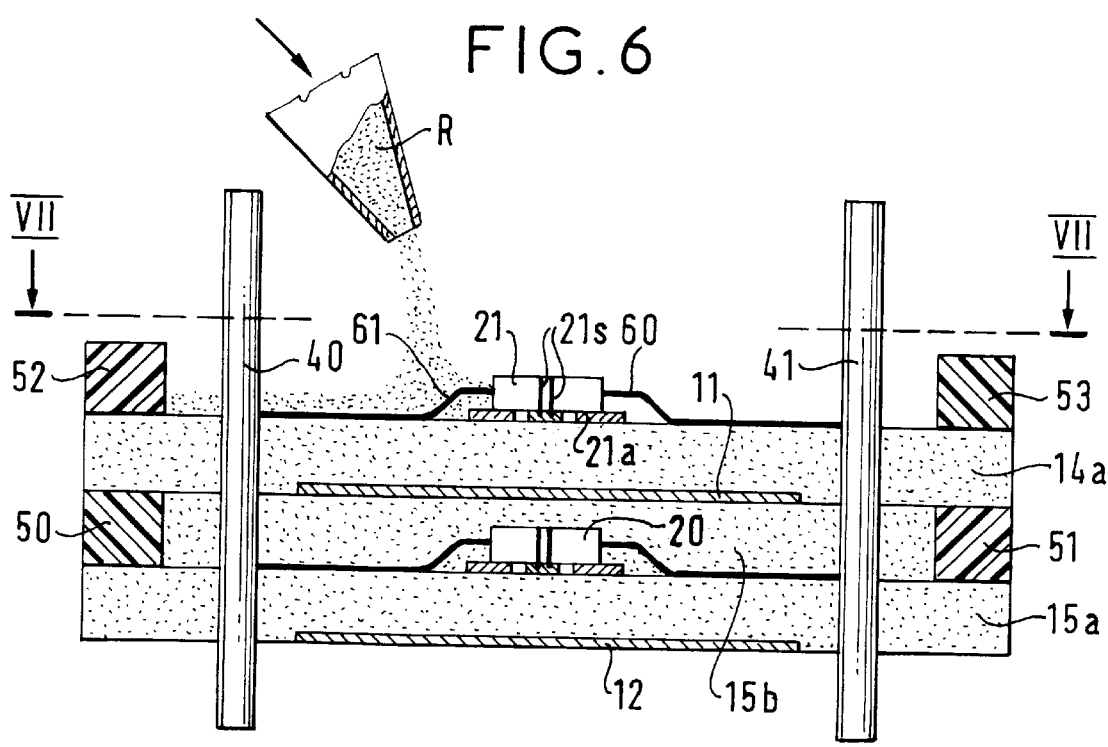
FIG. 6 is a cross-section view of a module of the invention while it is being manufactured.
Figure 7:
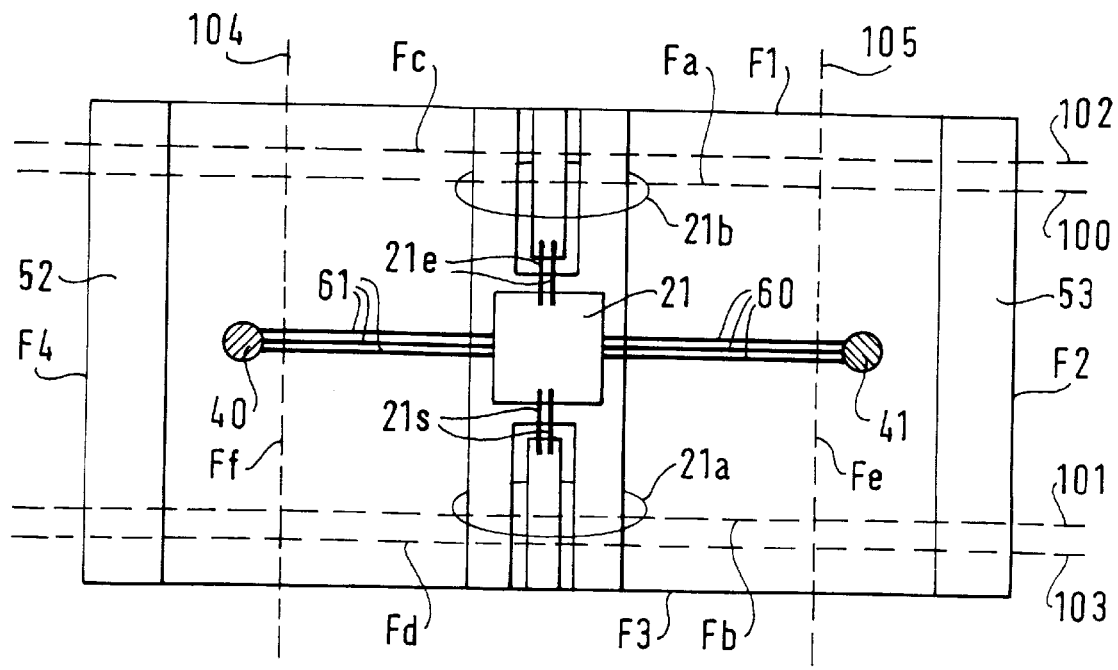
FIG. 7 is a cross-section view of the module, showing the successive cutting planes defined during manufacture to obtain a module of the invention.

With reference to FIGS. 6 and 7, a description follows of a method of manufacturing a module of the invention, as described with reference to FIGS. 1 to 3.

For this method, a rectangular mold (not shown) is provided on a closed-off bottom from which guide means extend, e.g. in the form of two elongate rods 40 and 41. A first elementary structure of the compact microwave module of the invention is then formed by inserting into the mold the bottom dielectric layer, or substrate, 15a of the elementary structure in question, the top face of this layer supporting the input and output coplanar lines 20a and 20b and the integrated circuit 20. The substrate 15a is provided with two transverse perforations to be guided by the two elongate rods 40 and 41 on being inserted into the mold. Then resin R is deposited on the top face of the substrate 15a to form the top layer 15b which covers the input coplanar line 20a, the output coplanar line 20b, and the integrated circuit 20. Then, a second elementary structure of the compact module is formed by inserting into the mold the bottom dielectric layer, or substrate, 14a of the second elementary structure, the top face of this bottom layer supporting the input coplanar line 21a and the output coplanar line 21b and the integrated circuit 21. Resin R is then deposited on the top face of the substrate 14a to form the top layer 14b which covers the input coplanar line 21a, the output coplanar line 21b, and the integrated circuit 21. By reiterating these operations, a plurality of elementary structures can thus be stacked. Spacers 50 & 51 and 52 & 53 disposed at the ends may be provided to separate the bottom layers 15a, 14a successively inserted in this way, thus ensuring that said bottom layers are disposed parallel to one another. After stacking up the desired number of elementary structures, the resulting structure which is in the form of a rectangular block is removed from the mold.

With reference to FIG. 7, this rectangular structure defining four side faces F1, F2, F3, and F4 is then cut on cutting planes 100 and 101 parallel to and inside respective ones of the facing faces F1 and F3, thereby causing two new faces Fa and Fb to appear. On each of the two faces Fa and Fb respective ends appear of the grounding conductors and of the signal conductor of the input coplanar line or the output coplanar line of each of the various elementary structures. The two faces Fa and Fb are then metal-plated. The resulting metal-plated faces are then etched to form each link intermediate line 30 between an input coplanar line and an output coplanar line. This etching is obtained by removing portions of the metal-plated surfaces of the two faces Fa and Fb.

The resulting modified rectangular structure is reinserted into the mold by being guided by the two elongate rods 40 and 41. Resin is injected over the outsides of the faces Fa and Fb so as to form a re-molded rectangular structure of dimensions equal to the dimensions of the first structure. The second structure is then removed from the mold to be cut, firstly on cutting planes 102 and 103 that are parallel to and inside respective ones of the facing faces F1 and F3, and secondly on cutting planes 104 and 105 that are parallel to and inside respective ones of the facing faces F4 and F2. A final rectangular structure is thus obtained defined by four side faces Fc, Fd, Fe, and Ff. The faces Fc and Fd are naturally outside respective ones of the faces Fa and Fb on which the link intermediate coplanar lines 30 are inscribed. When a ground plane 11, 12 is provided to separate two immediately adjacent modules, for each ground plane, provision is made to machine, typically by laser, the resin on at least one of the faces Fc, Fd, Fe, and Ff at points facing the edges of the ground plane, so as to form an access perforation between the ground plane and the outside. The final structure is then metal plated over its entire surface including the access perforations. This metal casing constitutes shielding for the module, which shielding is in electrical contact with the ground planes 11, 12.

No mention is made above of the low-frequency (LF) wires typically used to feed the circuits 20 and 21. As shown in FIG. 7, for each elementary structure, these wires 60, 61 are carried by the top face of the bottom layer, or substrate, 14a, 15a on which the integrated circuit 21, 20 is mounted. These wires extend towards the faces Fe and Ff. These faces Fe and Ff, which are metal-plated as a result of the above-described metal-plating step, are then etched to form each link intermediate wire for linking to an LF signal source.

In practice, it is possible to extend the above description to an embodiment using multi-layer low-frequency wires. In which case, the following iterative steps are provided:

molding, laser machining, metal-plating of the face in question, and etching. A molding step of rank P serves to cover over with resin the LF wires formed by etching during the etching step of rank (P-1), a laser machining step of rank P serving to form access perforations for providing access to the etching of rank (P-1), and the metal-plating and etching steps of rank P serving to form the desired LF etching multi-layer pattern.

We claim:

1. A microwave module comprising:
    a plurality of stacked elementary structures forming a unit, each elementary structure comprising a bottom dielectric layer (14a, 15a) on a top surface of which an integrated circuit (20, 21) is disposed, and a top dielectric layer (14b, 15b) covering the circuit (20, 21); and
    a connection line (30) for connecting a first integrated circuit (20) mounted on a dielectric layer of a first structure of said plurality of structures to a second integrated circuit (21) mounted on a dielectric layer of a second structure of said plurality of structures;
    wherein said connection line (20a, 30, 21a) comprises an input coplanar line (21a) disposed on the top surface of the bottom dielectric layer of the first structure, an output coplanar line (20a) disposed on the top surface of the bottom dielectric layer of the second structure, and a link coplanar line (30) connecting one end of the input coplanar line to one end of the output coplanar line;
    wherein a given elementary structure is separated from an immediately adjacent elementary structure by a ground element (10, 11), and both said input coplanar line (21a) and said output coplanar line (20a) extend beyond planes including the respective edges of the ground element separating said first elementary structure and said second elementary structure, so that said link coplanar line (30) is offset outwardly relative to the ground element.

2. A compact microwave module comprising:
    a plurality of stacked elementary structures forming a unit, each elementary structure comprising a bottom dielectric layer (14a, 15a) on a top surface of which an integrated circuit (20, 21) is disposed, and a top dielectric layer (14b, 15b) covering the circuit (20, 21); and
    a connection line (20a, 31, 20b) for connecting a first integrated circuit (20) mounted on a bottom dielectric layer of a first structure of said plurality of structures to a second integrated circuit (21) mounted on a bottom dielectric layer of a second structure of said plurality of structures;
    a ground element (10, 11) for separating each given elementary structure from an immediately adjacent elementary structure;
    said connection line including an input coplanar line (21a) which is disposed on the top surface of the bottom dielectric layer of the first structure, an output coplanar line which is disposed on the top surface of the bottom dielectric layer of the second structure, and a link line comprising firstly a signal first conductor strand (311) connecting a signal conductor (211a) of the input coplanar line (21a) to a signal conductor (201a) of the output coplanar line (20a) via a first hole (H) through each bottom and top dielectric layer and through each ground element separating said two circuits, and secondly at least one grounding second conductor strand (310–314) connecting at least one of the grounding conductors of the input coplanar line to at least one of the grounding conductors of the output coplanar line via a respective second hole passing through each bottom and top dielectric layer and through each ground element separating said two circuits (20, 21).

3. A module according to claim 2, said at least one grounding second conductor strand is in contact with each ground element separating said two circuits (20, 21).

4. A module according to claim 2, in that said at least one grounding second conductor strand is formed by metal plating said second hole.

5. A module according to claim 2, wherein the two grounding conductors of each of said input and output coplanar lines are connected together at their respective ends via an additional grounding conductor (203a, 213a).

6. A module according to claim 5, further including a plurality of second strands (310–314) connecting together said grounding conductors and said additional grounding conductor of the input coplanar line and said grounding conductors and said additional conductor of the output coplanar line, said plurality of ground second conductor strands surrounding at least in part said signal first conductor.

7. A module according to claim 6, wherein said plurality of second strands is disposed in a circular arc around said signal first conductor.

8. A method of manufacturing a microwave module including the steps of:
    molding a rectangular unit comprising a plurality of stacked elementary structures, each elementary structure comprising a bottom dielectric layer on a top surface of which an integrated circuit (20, 21), ground conductors and a signal conductor are disposed, and a top dielectric layer covering the circuit, ground conductors and signal conductor;
    cutting said unit along parallel cutting planes (100, 101) to expose two new faces (Fa, Fb) on which respective sets of ends of the ground conductors and of the signal conductor are provided, each set being associated with a respective coplanar line;
    metal plating said two new faces (Fa, Fb); and
    etching the metal-plated new faces so as to form a link coplanar line connecting the ends of ground conductors and of a signal conductor of an input coplanar line of a first elementary structure to respective ends of ground conductors and of a signal conductor of an output coplanar line of a second elementary structure.

9. A method according to claim 8 further including the step of interposing a ground element between adjacent elementary structures of the rectangular unit.

10. A method according to claim 9, further including the steps of:
    re-molding the etched unit so as to cover the link coplanar line with a dielectric casing;
    machining the re-molded etched unit through at least one of its faces at points facing the edges of the ground element so as to form access perforations between each ground element and the outside; and
    shielding the unit by metal plating the entire unit, said shielding being in electrical connection with the ground element via said metal-plated access perforations.

11. A method according to claim 10, further includes a step in which at least one face of said metal-plated unit is etched so as to form low-frequency link wires.

12. A method according to claim 11, including the following iterative steps: re-molding said etched metal-plated unit, laser machining, metal plating and then etching so as to form multi-layer low-frequency wires.

13. An active antenna comprising a plurality of microwave modules, each of said plurality of microwave modules comprising:

a plurality of stacked elementary structures forming a unit, each elementary structure comprising a bottom dielectric layer (14a, 15a) on a top surface of which an integrated circuit (20, 21) is disposed, and a top dielectric layer (14b, 15b) covering the circuit (20, 21); and a connection line (30) for connecting a first integrated circuit (20) mounted on a dielectric layer of a first structure of said plurality of structures to a second integrated circuit (21) mounted on a dielectric layer of a second structure of said plurality of structures;

wherein said connection line (20a, 30, 21a) comprises an input coplanar line (21a) disposed on the top surface of the bottom dielectric layer of the first structure, an output coplanar line (20a) disposed on the top surface of the bottom dielectric layer of the second structure, and a link coplanar line (30) connecting one end of the input coplanar line to one end of the output coplanar line;

wherein a given elementary structure is separated from an immediately adjacent elementary structure by a ground element (10, 11) and both said input coplanar line (21a) and said output coplanar line (20a) extend beyond planes including the respective edges of the ground element separating said first elementary structure and said second elementary structure, so that said link coplanar line (30) is offset outwardly relative to the ground element.

14. An active antenna comprising a plurality of microwave modules, each of said plurality of microwave modules comprising:

a plurality of stacked elementary structures forming a unit, each elementary structure comprising a bottom dielectric layer (14a, 15a) on a top surface of which an integrated circuit (20, 21) is disposed, and a top dielectric layer (14b, 15b) covering the circuit (20, 21); and a connection line (20a, 31, 20b) for connecting a first integrated circuit (20) mounted on a bottom dielectric layer of a first structure of said plurality of structures to a second integrated circuit (21) mounted on a bottom dielectric layer of a second structure of said plurality of structures;

a ground element (10, 11) for separating each given elementary structure from an immediately adjacent elementary structure; said connection line including an input 20 coplanar line (21a) which is disposed on the top surface of the bottom dielectric layer of the first structure, an output coplanar line which is disposed on the top surface of the bottom dielectric layer of the second structure, and a link line comprising firstly a signal first conductor strand (311) connecting a signal conductor (211a) of the input coplanar line (21a) to a signal conductor (201a) of the output coplanar line (20a) via a first hole (H) through each bottom and top dielectric layer and through each ground element separating said two circuits, and secondly at least one grounding second conductor strand (310–314) connecting at least one of the grounding conductors of the input coplanar line to at least one of the grounding conductors of the output coplanar line via a respective second hole passing through each bottom and top dielectric layer and through each ground element separating said two circuits (20, 21).

\* \* \* \* \*